(12) United States Patent
Bhansali

(10) Patent No.: US 8,058,155 B1
(45) Date of Patent: Nov. 15, 2011

(54) INTEGRATED NANOWIRES/MICROELECTRODE ARRAY FOR BIOSENSING

(75) Inventor: Shekhar Bhansali, Tampa, FL (US)

(73) Assignee: University of South Florida, Tampa, FL (US)

( * ) Notice: Subject to any disclaimer, the term of this patent is extended or adjusted under 35 U.S.C. 154(b) by 183 days.

(21) Appl. No.: 12/182,506

(22) Filed: Jul. 30, 2008

Related U.S. Application Data

(60) Provisional application No. 60/962,505, filed on Jul. 30, 2007.

(51) Int. Cl.
*H01L 21/20* (2006.01)
*H01L 21/36* (2006.01)

(52) U.S. Cl. ............... 438/478; 438/22; 438/34; 438/40; 438/43; 438/962; 257/19; 257/14; 257/9

(58) Field of Classification Search .................... None
See application file for complete search history.

(56) References Cited

U.S. PATENT DOCUMENTS

| | | | |
|---|---|---|---|
| 7,181,836 B2 | 2/2007 | Tsakalakos | |
| 2004/0067602 A1* | 4/2004 | Jin | ................. 438/22 |
| 2005/0045875 A1 | 3/2005 | Lai et al. | |
| 2005/0133254 A1 | 6/2005 | Tsakalakos | |
| 2006/0054881 A1* | 3/2006 | Li et al. | ............ 257/19 |
| 2006/0255481 A1* | 11/2006 | Pan et al. | ........... 257/E51.04 |
| 2008/0224115 A1* | 9/2008 | Bakkers et al. | ................ 257/1 |
| 2008/0246020 A1* | 10/2008 | Kawashima et al. | ........... 257/24 |

FOREIGN PATENT DOCUMENTS
WO    2006042276 A2    4/2006

OTHER PUBLICATIONS

Yong J. Yuan, Mike K. Andrews, W. M. Arnold, and Barry K. Marlow. "Electric-field-mediated fabrication of nano/microstructures." Proc. SPIE. vol. 5118. pp. 421.2003.
Cheng, Chuanding, PhD. "Development of palladium nanowires." Dissertation. Louisiana Tech University. pp. 5575. Nov. 2005.
Gu, Qun. "DNA-templated assembly of metallic nanowires." Dissertation. Louisiana Tech University. pp. 3862. Aug. 2005.
Aravamudhan, K. Luongo, P. Poddar, H. Srikanth and S. Bhansali. "Porous silicon templates for electrodeposition of nanostructures." Applied Physics A: Materials Science & Processing. vol. 87. No. 4. Jun. 2007. pp. 773-780.

(Continued)

*Primary Examiner* — Ha Tran T Nguyen
*Assistant Examiner* — Shantanu C Pathak
(74) *Attorney, Agent, or Firm* — Wanhua Zhao; Courtney M. Dunn; Smith & Hopen, P.A.

(57) ABSTRACT

The present invention provides a method for the controlled synthesis of nanostructures on the edges of electrodes and an apparatus capable of optical and electrochemical sensing. In accordance with the present invention, a method of fabricating nanowires is provided. In one embodiment, the method includes providing a substrate, creating a dielectric thereon, depositing a metal catalyst on the dielectric, patterning the metal catalyst, selectively etching dielectric, creating an electric field originating in metal catalyst, and applying a heat treatment. In another embodiment, the method includes providing a substrate, depositing a dielectric thereon, printing a metal catalyst on the dielectric and plastic substrate, printing silicide along the edges of metal catalyst, creating an electric field originating in metal catalyst; and applying chemical vapor deposition. The apparatus of the present invention comprise an electrode with nanowires grown thereon, wherein the nanowires' placement and direction of growth is controlled.

15 Claims, 6 Drawing Sheets

OTHER PUBLICATIONS

Arun Kumar, Shyam Aravamudhan, Milorad Gordic, Shekhar Bhansali and Shyam S. Mohapatra. "Ultrasensitive detection of cortisol with enzyme fragment complementation technology using functionalized nanowire." Biosensors and Bioelectronics. vol. 22. Issues 9-10. Nov. 9, 2006. pp. 2138-2144.

Shyam Aravamudhan, Arun Kumar, Shyam Mohapatra and Shekhar Bhansali. "Sensitive estimation of total cholesterol in blood using Au nanowires based micro-fluidic platform." Biosensors and Bioelectronics. vol. 22. Issues 9-10. Jan. 9, 2007. pp. 2289-2294.

Praveen Kumar Sekhar, Senthil N Sambandam, Dinesh K Sood and Shakhar Bhansali. "Selective growth of silica nanowires in silicon catalysed by Pt thin film." Nanotechnology 17. Aug. 29, 2006. pp. 4606-4613.

Dinish Kumar Sood, Praveen Kumar Sekhar and Shekhar Bhansali. "Ion implantation based selective synthesis of silica nanowires on silicon wafers." Appl. Phys. Lett. vol. 88. Issue 14. Nanoscale Science and Design. Apr. 4, 2006.

Clint J. Novotny, Edward T. Yu, and Paul K. L. Yu. "InP Nanowire/Polymer Hybrid Photodiode." American Chemical Society. vol. 8. No. 3. 2008. pp. 775-779.

* cited by examiner

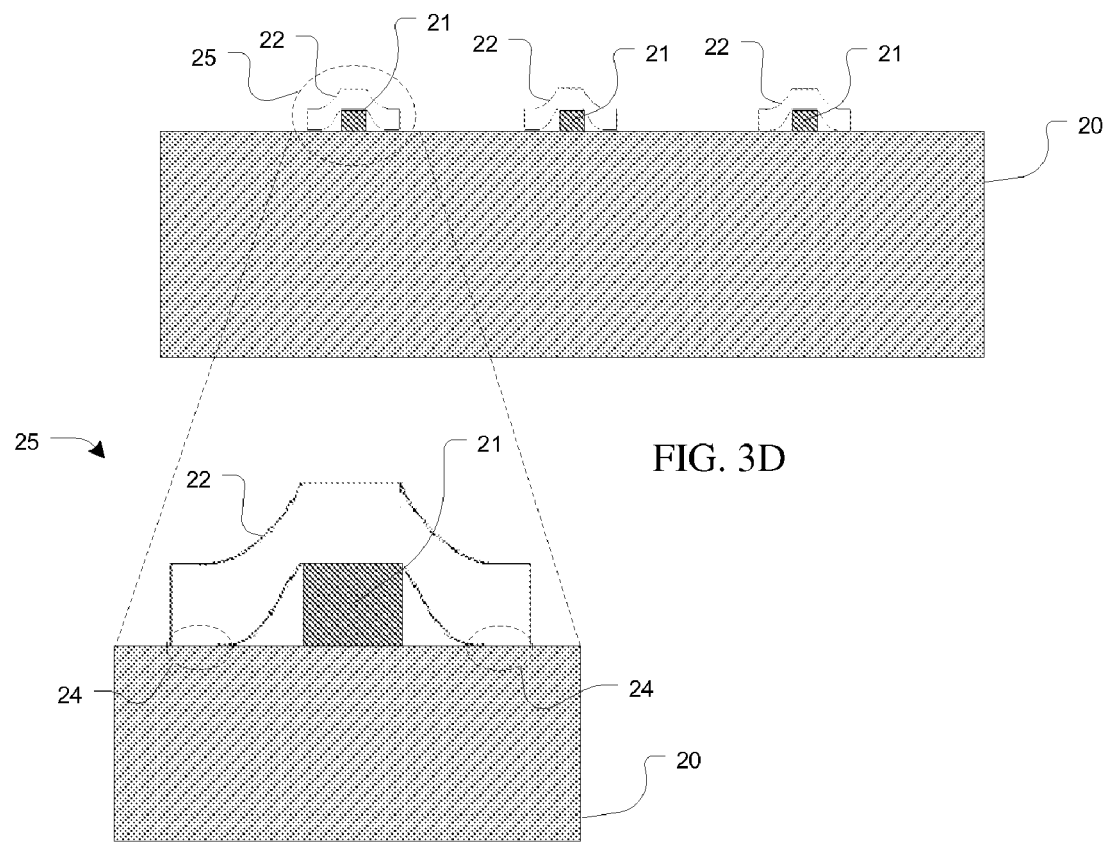
FIG. 3D
FIG. 3E
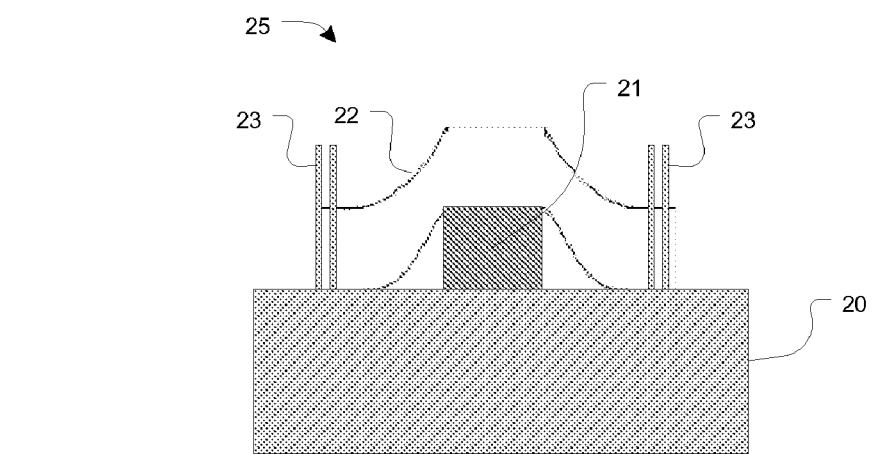
FIG. 3F

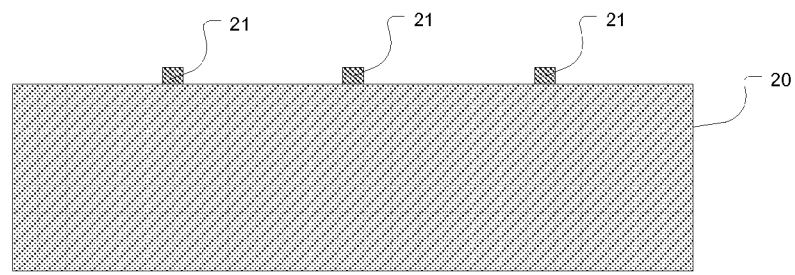
FIG. 4A
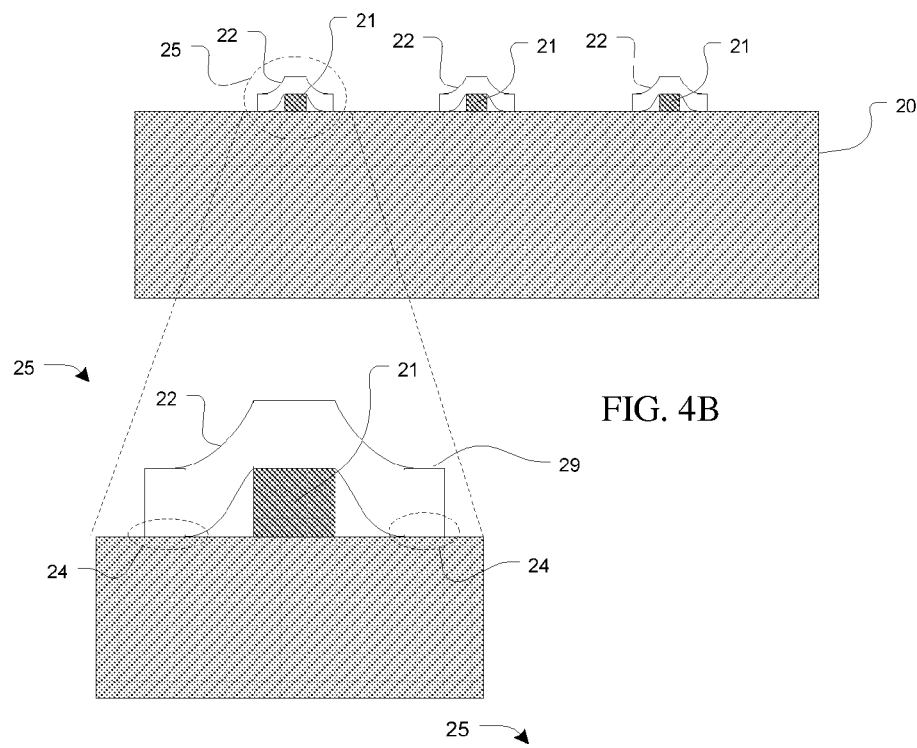
FIG. 4B
FIG. 4C
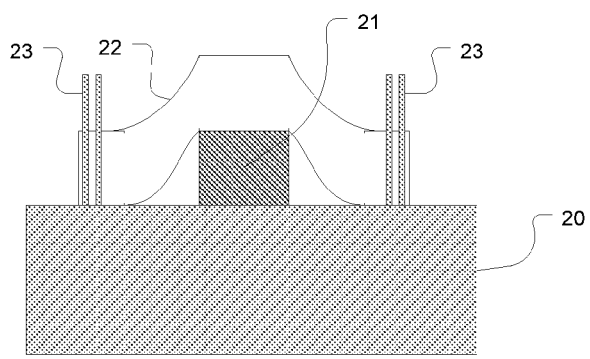
FIG. 4D

INTEGRATED NANOWIRES/MICROELECTRODE ARRAY FOR BIOSENSING

CROSS REFERENCE TO RELATED APPLICATIONS

This application claims priority to currently co-pending U.S. Provisional Patent Application 60/962,505, filed Jul. 30, 2007.

FIELD OF INVENTION

This invention relates to the growth of nanostructures on microelectrodes for use in electrochemical and optical sensing.

BACKGROUND OF INVENTION

One-dimensional nanostructures, such as nanotubes and nanowires, of different types of materials, such as elemental semiconductors, compound semiconductors, and oxides, are increasingly being investigated for a wide variety of future nanotechnology applications. As nanowires will be a critical interconnect element of any nanosystem, the ability to produce them at a desired location, in a controlled manner, is of great importance.

Of the numerous one-dimensional structures, silica nanowires are a subject of intense research in view of their potential for unique applications, such as localization of light, low dimensional waveguides for functional microphotonics, scanning near field optical microscopy (SNFOM), optical interconnects on a futuristic integrated optical microchip, sacrificial templates, biosensors, and optical transmission antennae.

Of the several methods used to produce nanowires, the Vapor-Liquid-Solid (VLS) mechanism for silicon whisker growth has proved to be very reliable for developing silica nanowires. In this method, the cluster acting as a seed for subsequent nanowire growth is either commonly synthesized by heating thin films or preformed. Recently, a method of using palladium ion implantation for the formation of catalyzing seed nanoclusters at or below the surface of a substrate and growing silica nanowires has been discovered. The vapor-liquid-solid model of nanowire formation facilitates controlled, localized, and directed bottom-up growth of silica nanowires. A series of diagrams explaining the ion implantation based seeding is shown in FIGS. 1A-E. As shown in FIG. 1A palladium (Pd) ions 10 are implanted on silicone (Si) wafer 11 through a mask. Then, as shown in FIG. 1B, PdSi clusters 12 form. FIGS. 1C-E show the growth of silica nanowires 13 using VLS.

Another method of growing nanowires is through the use of Chemical Vapor Deposition (CVD). CVD is a chemical process often used in the semiconductor industry to produce thin films. A substrate is exposed to one or more catalysts, which then react and/or decompose on the substrate surface to produce the desired deposit. In nanowires growth, CVD is a bottom-up approach. Catalysts, such as gold, are deposited on a substrate and act as an attraction site for nanowire formation. The substrate is put in a gas chamber containing the appropriate element, such as silicon. Atoms from the gas and catalysts attach, creating a chain or wire.

Although a method for growing nanowires in clusters exist, no method exists for controlled growth of nanowires in specific patterns/lines. An improved method is needed in the art for synthesis of nanostructures in a controlled pattern. Further, an apparatus capable of improved simultaneous optical and electrochemical sensing is needed.

SUMMARY OF INVENTION

The present invention includes a method for the controlled synthesis of nanostructures on the edges of electrodes and an apparatus capable of improved simultaneous optical and electrochemical sensing.

In accordance with the present invention, a method of fabricating nanowires by using a Vapor-Liquid-Solid (VLS) mechanism and an electric field is provided. In an embodiment, the method includes the steps of providing a substrate having at least a first side, creating a dielectric layer on the first side of substrate, depositing a metal catalyst layer on the dielectric layer, patterning the metal catalyst layer, selectively etching the dielectric layer using the patterned metal catalyst as a mask, creating an electric field originating in the patterned metal catalyst, and applying a heat treatment under the electric field. The dielectric layer may be created by oxidizing the first side of the substrate. The electric field originating in the patterned metal catalyst may be created by applying a charge to the patterned metal catalyst. In a preferred embodiment, the substrate is a silicon wafer and the metal catalyst is gold.

In accordance with the present invention, a method of fabricating nanowires by using Chemical Vapor Deposition (CVD) and an electric field is provided. In an embodiment, the method includes the steps of providing a substrate, depositing a dielectric, having at least three sides, on the substrate, printing a metal catalyst, having at least two edges, on the dielectric and plastic substrate such that the metal catalyst covers the dielectric's first side, the first edge contacts plastic substrate on the dielectric's second side, and the second edge contacts the plastic substrate on the dielectric's third side, printing silicide along the edges of the metal catalyst, creating an electric field originating in the metal catalyst, and applying chemical vapor deposition under the electric field. The electric field, originating in the metal catalyst, may be created by applying a charge to the metal catalyst. In a preferred embodiment, the substrate is a plastic substrate and the metal catalyst is gold.

In accordance with the present invention, an electrode capable of improved simultaneous optical and electrochemical sensing is provided. The electrode comprises a substrate having a width, a dielectric on the substrate having a width shorter than substrate's width and at least three sides, a metal catalyst in releasable contact with the first side of the dielectric and releasably contacting the substrate along the second and third sides of the dielectric, creating two substrate-metal contact areas, and a plurality of nanowires positioned substantially perpendicular to the substrate's surface and along the substrate-metal contact areas. In an embodiment of the present invention, the electrode may further comprise an electric charge applied to the metal catalyst, whereby an electric field is created. In an embodiment, the substrate is a silicon wafer and the dielectric is silicon dioxide. In another embodiment, the substrate may be a plastic substrate. The metal catalyst may be gold. The metal catalyst and the first side of dielectric are in contact prior to growth of the nanowires; however, they may lose contact as the nanowires grow. In addition, the substrate and the second and third sides of the dielectric are in contact prior to growth of the nanowires; however, they may lose contact as the nanowires grow.

Accordingly, the present invention includes a method of growing nanowires in a controlled manner on the edge of electrodes. The nanowires created improve the sensitivity of standard optical sensing techniques and provides greater sensitivity in electrochemical sensing when the optical signal falls below standard optical detection techniques.

BRIEF DESCRIPTION OF THE DRAWINGS

For a fuller understanding of the invention, reference should be made to the following detailed description, taken in connection with the accompanying drawings, in which:

FIGS. 3A-F is an illustration of the process flow for the fabrication of nanowires in accordance with an embodiment of the present invention.

FIGS. 4A-D is an illustration of the process flow for the fabrication of nanowires in accordance with an embodiment of the present invention.

DETAILED DESCRIPTION OF THE PREFERRED EMBODIMENT

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The need for an improved sensor and method for the fabrication of nanowires is now met by a new, useful, and non-obvious invention.

Figures 1A, 1B, 1C, 1D, 1E:
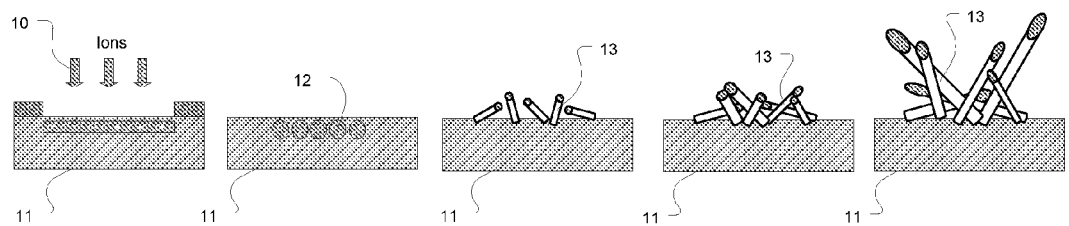
FIG. 1 is an illustration of the process flow for the fabrication of nanowires in clusters using ion implantation-based seeding.
Figure 2:
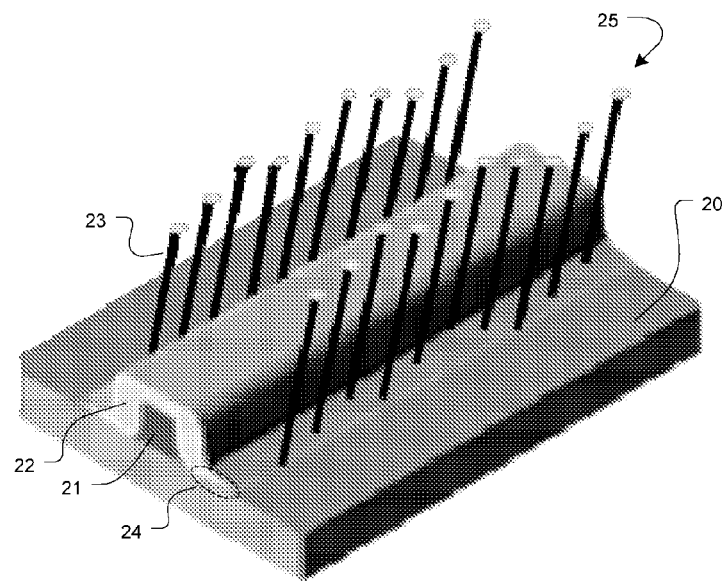
FIG. 2 is an illustration of an electrode with nanowires aligned thereon in accordance with the present invention.

With reference to FIG. 2, the present invention provides an electrode 25 comprising substrate 20, dielectric 21 positioned on substrate 20, metal catalyst 22 positioned on dielectric 21 and contacting 24 substrate 20 along two sides of dielectric 21, and a plurality of nanowires 23 positioned along contact area 24 substantially perpendicular to substrate's 20 surface. Metal catalyst 22 may act as a conductor between contact areas 24. Electrode may further comprises an electric charge applied to metal catalyst, creating an electric field. As nanowires 23 grow metal catalyst 22 and dielectric 21 may lose direct contact. Nanowire 23 growth may also sever direct contact between dielectric 21 and substrate 20, making the only contact at contact area 24 via the connection make by nanowires 23. Electrode 25 is not shorted and its conductivity remains unchanged by nanowires 23.

Figure 3A:
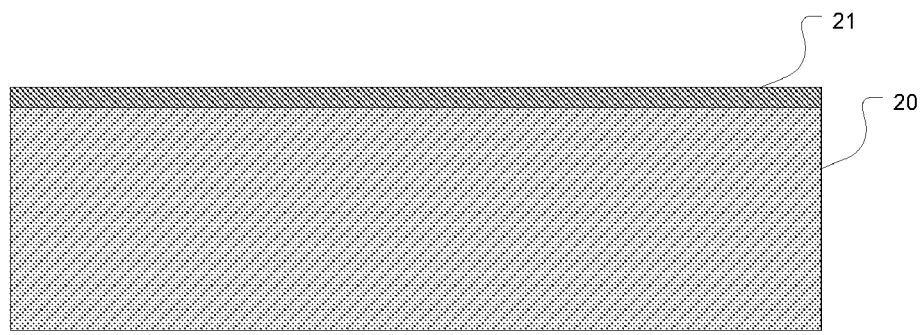
Figure 3B:
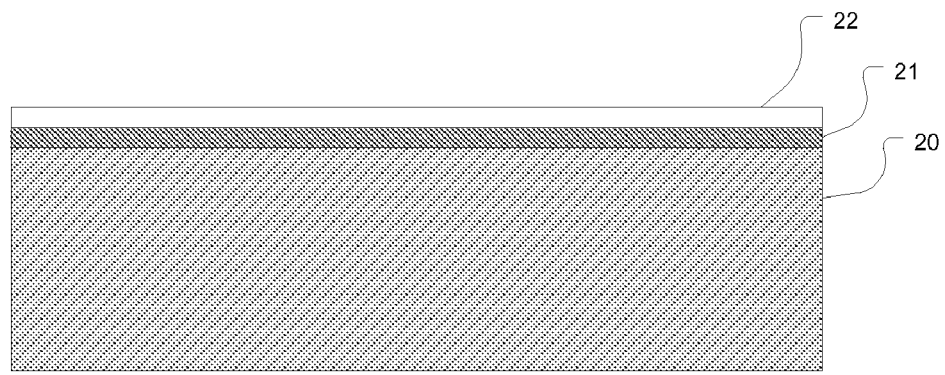
Figure 3C:
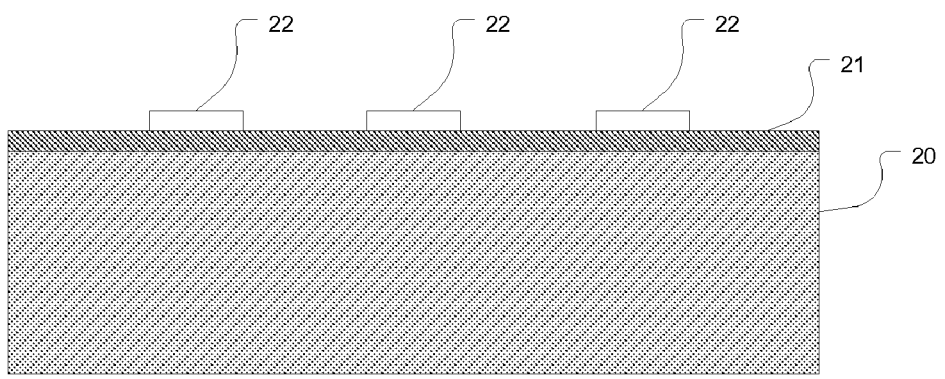

With reference to FIG. 3, the present invention provides a novel method for growing nanowires along the edge of an electrode of a microstructure incorporating the VLS mechanism for nanowire growth. In an embodiment of the present invention, as illustrated in FIG. 3A, substrate 20 is oxidized creating dielectric 21. In a preferred embodiment, substrate 20 is a silicon wafer and dielectric 21 is silicon dioxide. However, other substrates and dielectrics are within the scope of the present invention. Metal catalyst 22 is deposited on dielectric 21, as shown in FIG. 3B. In a preferred embodiment, the metal catalyst is gold. However, other metal catalysts are within the scope of the present invention. As shown in FIG. 3C, metal catalyst 22 is then patterned with a desired pattern. Self-aligned etching is then used to etch away dielectric 21 as shown in FIGS. 3D-E. Metal catalyst 22 is used as a mask in the selective etching process. As a result, metal catalyst 22 is in removable contact 24 with substrate 20 on two sides of etched dielectric 21 and is also in removable contact with the remaining portion of dielectric 21. Metal catalyst 22 then acts as a conductor between contact areas 24. As in the traditional VLS mechanism, a heat treatment is applied; however, here, the heat treatment is applied under an electric field. The electric field is created by a charge applied to conducting metal catalyst 22. The heat treatment, under the electric field, causes the growth of nanowires 23 at the edge of electrode 25, through contact areas 24. As illustrated in FIG. 3F, the electric field forces the aligned growth of nanowires 23 in a position substantially perpendicular to substrate's 20 surface. The heat treatment, under the electric field, allows for the aligned growth of nanowires 23 without shorting electrode 25 and without affecting the conductivity of the electrode 25. As nanowires 23 grow, metal catalyst 22 and substrate 20, creating the contact areas 24, may lose contact. In addition, nanowire 23 growth may sever contact between metal catalyst 22 and dielectric 21.

The present invention also provides a novel method for growing nanowires along the edges of an electrode incorporating CVD for nanowire growth. In an embodiment of the present invention, as illustrated in FIG. 4A, dielectric 21 is deposited on substrate 20. In a preferred embodiment, substrate 20 is a plastic substrate. However, other substrates are within the scope of the present invention. Then metal catalyst 22 is printed on dielectric 21 and substrate 20, as shown in FIGS. 4B and 4C. In a preferred embodiment, the metal catalyst 22 is gold. However, other metal catalysts are within the scope of the present invention. Metal catalyst 22 is printed such that metal catalyst 22 contacts dielectric 21 and also contacts 24 plastic substrate 20 on two sides of dielectric 21. Silicide is then printed at the edges 29 of metal catalyst 22. Nanowire 23 growth is then stimulated by a tradition Chemical Vapor Deposition (CVD); however, here the CVD is completed under an electric field. The electric filed is created by a charge applied to metal catalyst 22, which acts as a conductor between contact areas 24. As illustrated in FIG. 4D, the CVD, under the electric field, causes the growth of nanowires 23 at the edge of electrode 25, through contact area 24. The electric field forces the aligned growth of nanowires 23 in a position substantially perpendicular to substrate's 20 surface. The CVD, under the electric field, allows for the aligned growth of nanowires 23 without shorting electrode 25 and without effecting the conductivity of the electrode 25. As nanowires 23 grow, metal catalyst 22 and plastic substrate 20, creating the metal-silicide stacks 24, may lose contact. In addition, nanowire 23 growth may sever contact between metal catalyst 22 and dielectric 21.

Sensors based on nanowires are increasingly being investigated because of unique optical, electronic, and biological sensing properties that this nanostructure offers. These properties aid in the development of reliable, improved, and fast detection techniques for sensors. The present invention provides a method for the fabrication of nanowires and their subsequent functionalization for use as sensors.

Figure 5:
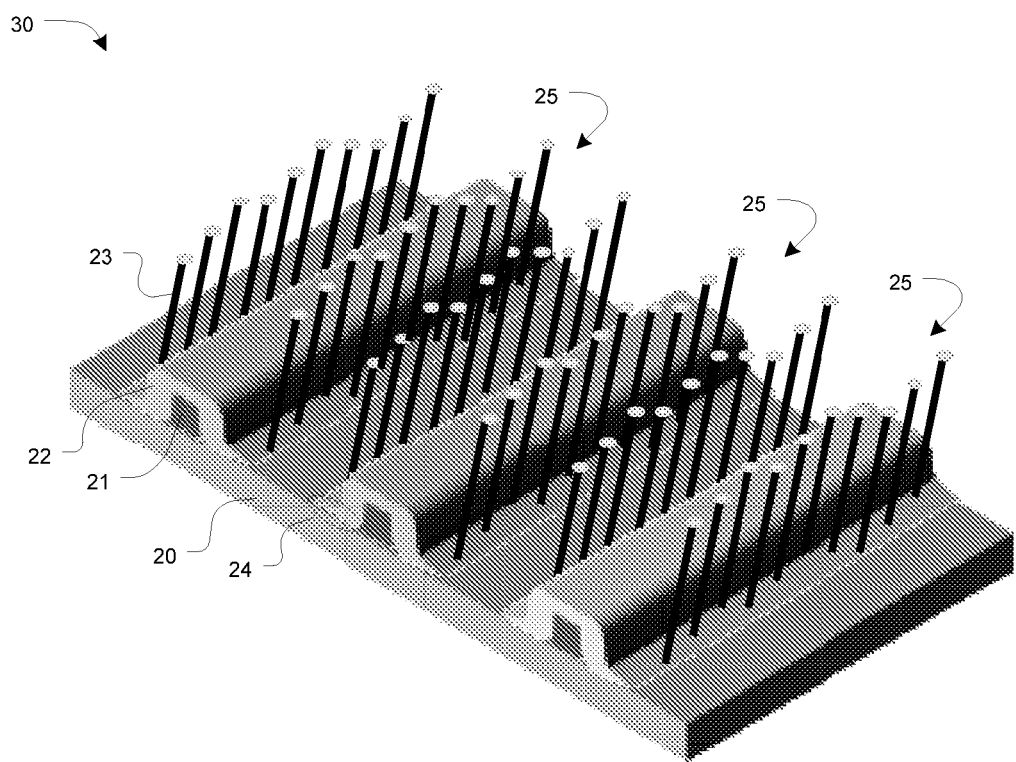
FIG. 5 is an illustration of an exemplary placement of nanowires on a substrate for use in a sensor in accordance with an embodiment of the present invention.

FIG. 5 illustrates electrode 25 of the present invention replicated three times on a single substrate 20. This microstructure 30 may be used in sensing application utilizing the present invention.

Figure 6:
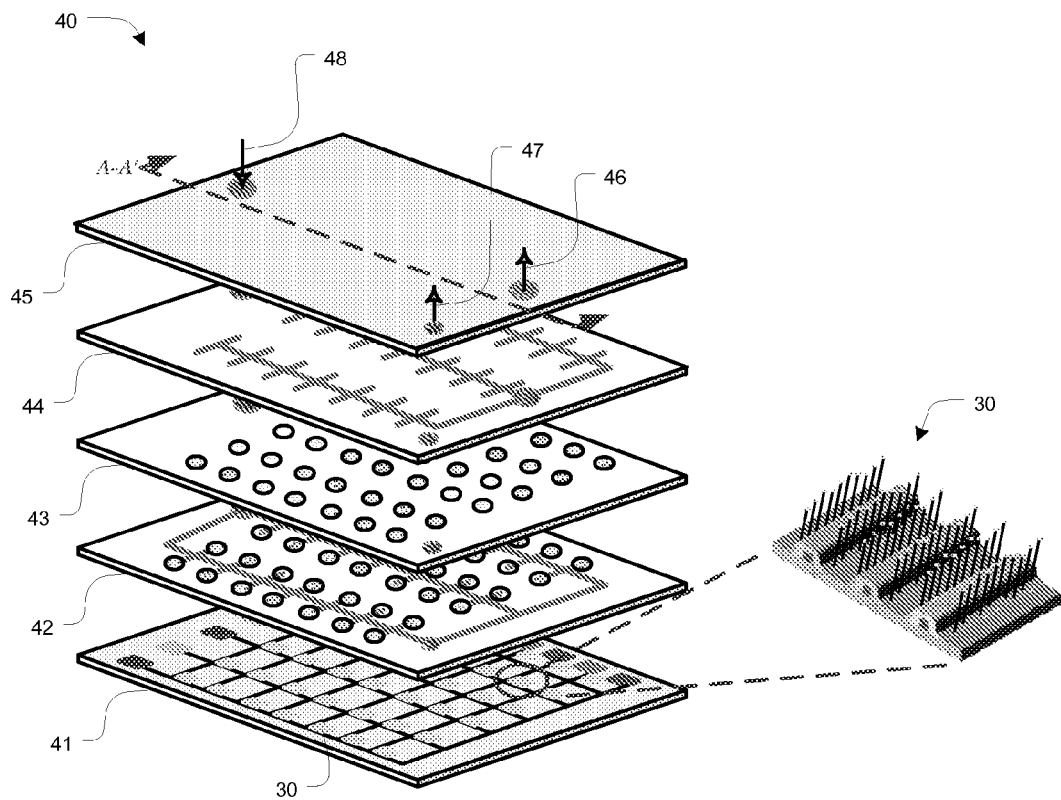
FIG. 6 is an illustration of the functionalized nanowires employed as sensors in a standard well plate system, shown in separate plates, in accordance with the present invention.
Figure 7:
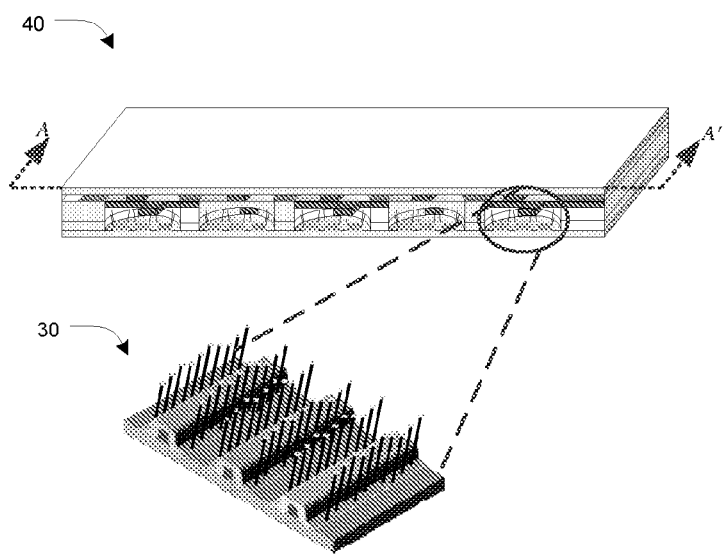
FIG. 7 is an illustration of the functionalized nanowires employed as sensors in a standard well plate system in accordance with the present invention.

FIGS. 6 and 7 illustrate a complete system-on-chip sensor realizing simultaneous optical and electrochemical detection. A standard 96-well plate system 40 comprising base plate 41, second plate 42 having microfluidic channels, third plate 43 having microfluidic wells, fourth plate 44 having microfluidic channels, and seal cap plate having reagent input 48, reagent output 46, and waste output 47.

In an exemplary embodiment, base plate 41 incorporates a plurality of microstructures 30. Microstructures 30 are spread over base plate 41 in a grid-like manner, as shown in FIG. 6. In this manner, the present invention improves the sensitivity of standard optical sensing techniques. In addition, when an optical signal falls below standard optical detection techniques, such as Luminex™, the electrochemical sensing capability of the present invention provides improved sensitivity.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall there between. Now that the invention has been described.

What is claimed is:

1. An electrode, comprising
   a substrate;
   a barrier dielectric having a first side, a second side, a third side, and a fourth side, positioned on the substrate such that only a portion thereof is in contact with the first side of the dielectric and creating a first exposed area of the substrate and a second exposed area of the substrate on the substrate;
   a catalyst positioned on the fourth side of the barrier dielectric and continued onto the first and second exposed area of the substrate;
   a plurality of nanowires grown on the catalyst in the first and second exposed areas of the substrate, wherein the nanowires are substantially perpendicular to the substrate's surface and substantially parallel to the second and the third side of the dielectric.

2. The electrode of claim 1, wherein the substrate is chosen from the group consisting of a silicon wafer and a plastic substrate.

3. The electrode of claim 1, wherein the barrier dielectric is silicon dioxide.

4. The electrode of claim 1, wherein the metal catalyst is gold.

5. The electrode of claim 1, wherein the plurality of nanowires are substantially aligned.

6. The electrode of claim 5, wherein the plurality of substantially aligned nanowires are substantially parallel to the barrier dielectric.

7. The electrode of claim 1, wherein the plurality of nanowires comprises at least a first and a second nanowire and the barrier dielectric further comprises at least a first side and a second side, wherein the first nanowire is on the barrier dielectric's first side and the second nanowire is on the barrier dielectric's second side and wherein there is no direct contact between the barrier dielectric and the plurality of nanowires.

8. The electrode of claim 1, wherein the catalyst is a metal catalyst.

9. The electrode of claim 1, wherein the catalyst is chosen from Au, Pd, Ni, Gd, Ge, Fe and Cu.

10. An electrode, comprising:
    a substrate;
    a dielectric, having a first side, a second side, a third side, and a fourth side, positioned on the substrate such that only a portion of the substrate is in contact with the first side of the dielectric and creating a first exposed area of the substrate and a second exposed area of the substrate;
    a catalyst positioned on the fourth side of the dielectric and continued onto the first and second exposed area of the substrate;
    a first plurality of nanowires grown on the catalyst in the first exposed area of the substrate, wherein the first plurality of nanowires is substantially perpendicular to the substrate's surface and substantially parallel to the second side and the third side of the dielectric;
    a second plurality of nanowires grown on the catalyst in the second exposed area of the substrate, wherein the second plurality of nanowires is substantially perpendicular to the substrate's surface and substantially parallel to the second side and the third side of the dielectric.

11. The electrode of claim 10, wherein the first plurality of nanowires are substantially aligned and the second plurality of nanowires are substantially aligned.

12. The electrode of claim 10, wherein the catalyst is not in direct contact with the second side and the third side of the dielectric.

13. The electrode of claim 10, wherein the catalyst is in contact with a portion of the first exposed area of the substrate.

14. The electrode of claim 10, wherein the catalyst is in contact with a portion of the second exposed area of the substrate.

15. The electrode of claim 10, wherein the nanowire is chosen from $Al_2O_3$, SnO, $SiO_2$, ZnO and CuO.

* * * * *